(12) United States Patent
Mertens et al.

(10) Patent No.: US 7,161,663 B2
(45) Date of Patent: Jan. 9, 2007

(54) LITHOGRAPHIC APPARATUS

(75) Inventors: Jeroen Johannes Sophia Maria Mertens, Duizel (NL); Sjoerd Nicolaas Lambertus Donders, 's-Hertogenbosch (NL); Christiaan Alexander Hoogendam, Veldhoven (NL); Bob Streefkerk, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 135 days.

(21) Appl. No.: 10/895,998

(22) Filed: Jul. 22, 2004

(65) Prior Publication Data

US 2006/0017893 A1 Jan. 26, 2006

(51) Int. Cl.
*G03B 27/32* (2006.01)
*G03B 27/58* (2006.01)

(52) U.S. Cl. .......................... 355/72; 355/77
(58) Field of Classification Search ............... 355/30, 355/72, 75, 77
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,247,579 B1* | 6/2001 | Fujiyama et al. | 198/775 |
| 6,400,445 B1* | 6/2002 | Nishi et al. | 355/72 |
| 6,560,032 B1 | 5/2003 | Hatano | 359/656 |
| 6,600,547 B1 | 7/2003 | Watson et al. | |
| 6,603,130 B1 | 8/2003 | Bisschops et al. | 250/492.1 |
| 6,633,365 B1 | 10/2003 | Suenaga | 355/53 |
| 2001/0047225 A1* | 11/2001 | Shimoike et al. | 700/250 |
| 2002/0020821 A1 | 2/2002 | Van Santen et al. | 250/492 |
| 2002/0089655 A1* | 7/2002 | Kida et al. | 355/72 |
| 2002/0163629 A1 | 11/2002 | Switkes et al. | 355/53 |
| 2002/0177094 A1* | 11/2002 | Shirakawa | 432/4 |
| 2003/0123040 A1 | 7/2003 | Almogy | 355/69 |
| 2003/0174408 A1 | 9/2003 | Rostalski et al. | 359/642 |

(Continued)

FOREIGN PATENT DOCUMENTS

DE 206 607 2/1984

(Continued)

OTHER PUBLICATIONS

U.S. Appl. No. 10/946,340, filed Sep. 22, 2004, Straaijer.

(Continued)

*Primary Examiner*—Rodney Fuller
(74) *Attorney, Agent, or Firm*—Pillsbury Winthrop Shaw Pittman LLP

(57) ABSTRACT

In an immersion-type lithographic apparatus, in which a surface of a substrate is immersed in liquid during an exposure operation, the substrate is held against a substrate table. On completion of the exposure operation, the substrate is lifted clear of the substrate table. In order to overcome a tendency caused by a film of residual liquid to cause the substrate to stick to the substrate table, pins used to lift the substrate are arranged and operated so that, at least initially, force is applied to the substrate at a location offset from its central axis.

19 Claims, 5 Drawing Sheets

U.S. PATENT DOCUMENTS

| | | | |
|---|---|---|---|
| 2004/0000627 A1 | 1/2004 | Schuster | |
| 2004/0021844 A1 | 2/2004 | Suenaga | |
| 2004/0075895 A1 | 4/2004 | Lin | 359/380 |
| 2004/0109237 A1 | 6/2004 | Epple et al. | |
| 2004/0114117 A1 | 6/2004 | Bleeker | |
| 2004/0119954 A1 | 6/2004 | Kawashima et al. | 355/30 |
| 2004/0125351 A1 | 7/2004 | Krautschik | 355/53 |
| 2004/0135099 A1 | 7/2004 | Simon et al. | |
| 2004/0136494 A1 | 7/2004 | Lof et al. | |
| 2004/0160582 A1 | 8/2004 | De Smit et al. | |
| 2004/0165159 A1 | 8/2004 | Lof et al. | |
| 2004/0207824 A1 | 10/2004 | Lof et al. | |
| 2004/0211920 A1 | 10/2004 | Derksen et al. | |
| 2005/0155823 A1* | 7/2005 | Hiroki et al. | 187/401 |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1039511 | 9/2000 |
| FR | 2474708 | 7/1981 |
| JP | 58-202448 | 11/1983 |
| JP | 62-065326 | 3/1987 |
| JP | 63-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |

OTHER PUBLICATIONS

U.S. Appl. No. 10/814,815, filed Apr. 1, 2004, Zaal et al.
U.S. Appl. No. 10/698,012, filed Oct. 31, 2003, Flagello et al.
U.S. Appl. No. 10/743,271, filed Dec. 23, 2003, Van Santen et al.
U.S. Appl. No. 10/743,266, filed Dec. 23, 2003, Mulkens et al.
U.S. Appl. No. 10/719,683, filed Nov. 24, 2003, Streefkerk et al.
U.S. Appl. No. 10/367,910, filed Feb. 19, 2003, Suwa et al.
M. Swtitkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths To Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.
G. Owen et al., "1/8 µm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics Technology/World, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No. 11, Apr. 1985, p. 6521.
A. Suzuki, "Lithography Advances on Multiple Fronts", EEdesign, EE Times, Jan. 5, 2004.
B. Lin, The $\kappa_3$ coefficient in nonparaxial $\lambda/NA$ scaling equations for resolution, depth of focus, and immersion lithography, *J. Microlith, Microfab., Microcryst.* 1(1):7-12 (2002).

* cited by examiner

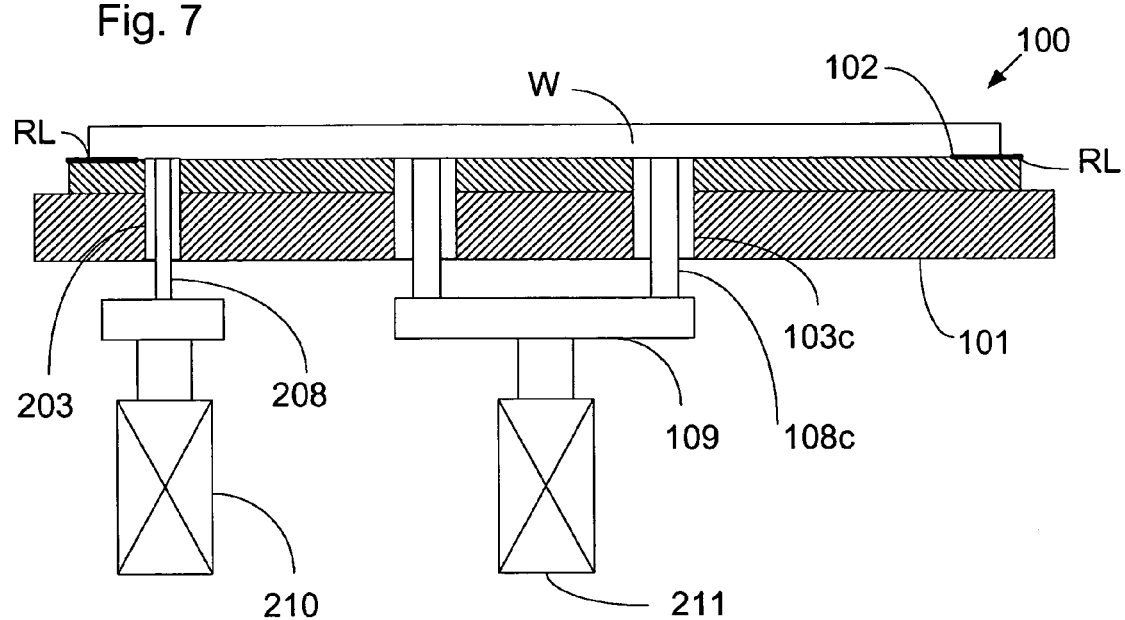
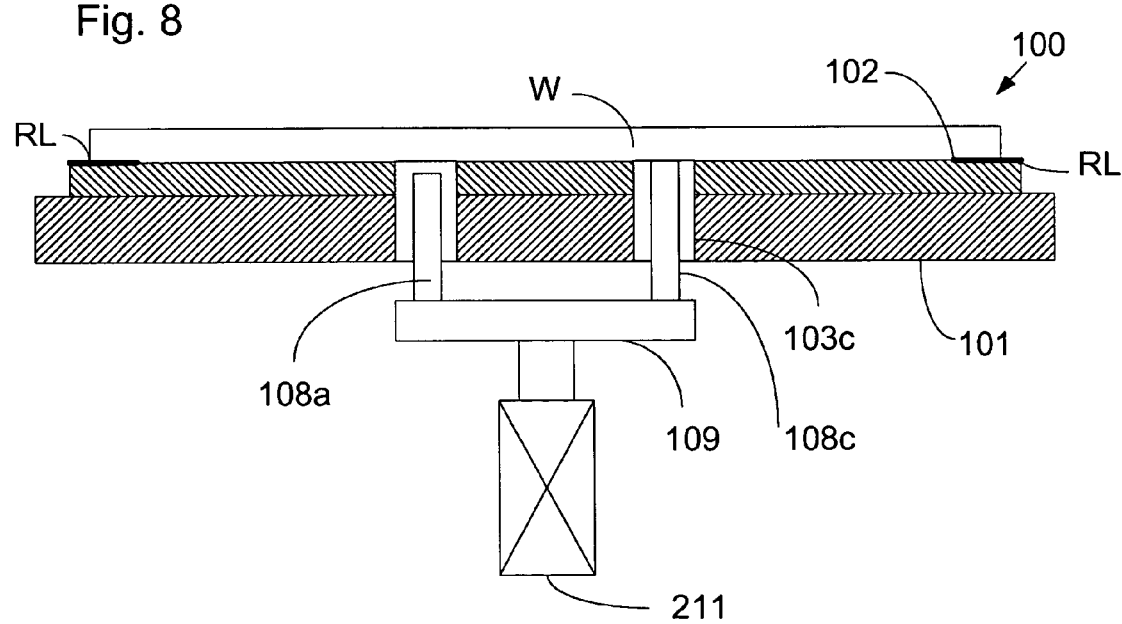

LITHOGRAPHIC APPARATUS

FIELD

The present invention relates to a lithographic projection apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example United States patent U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

During operations involving immersion of the substrate, the substrate may be held by suction on a substrate table of a lithographic apparatus by evacuating gas from a region below the substrate. After an exposure is complete and the immersion liquid has been removed off the upper surface of the substrate, the suction is discontinued and the substrate is released from the substrate table and carried away e.g. supported on the tines of a motor-driven fork. For the purpose of releasing the substrate, it is known to use a substrate release mechanism comprising a number of pins which are driven upwardly through holes in a substrate table surface and against the lower face of the substrate to lift it clear of the substrate table. The tines of the fork are then inserted horizontally between the substrate table and the substrate and the pins are retracted (lowered) somewhat to allow the substrate to settle onto the fork.

Although such a substrate release mechanism generally allows satisfactory handling of the substrate, occasionally, an unforeseen problem may arise, namely that the pins may fail to release the substrate from the substrate table. This failure to release may occur, for example, when a thin film of the immersion liquid remains around the periphery of the substrate and extends partway in between the upper surface of the substrate table and the lower surface of the substrate—this film acts to adhere the substrate to the substrate table, likely by capillary action and surface tension.

Thus, an embodiment of the present invention relates to a substrate releasing mechanism for use in an immersion-type lithographic apparatus, configured to displace a substrate clear of the substrate table after a step involving immersion of the substrate while held on the substrate table.

In an embodiment, a substrate release mechanism is provided for an immersion-type lithographic apparatus that comprises a pin arrangement which exhibits an asymmetry in terms of how it acts on the substrate during its initial engagement with the substrate. This asymmetry can have the effect of concentrating the lifting force on an edge portion of the substrate (without significantly bending the substrate), so that the sticking of the substrate to a substrate table surface is overcome at that point earlier than at other locations on or around the periphery of the substrate. In this way, the sticking effect of a residual liquid film is progressively overcome without the pins stalling or the substrate being damaged.

As discussed herein, embodiments of the invention include ones in which the pins, at least the ones which lift the substrate clear of the substrate table, are disposed in a symmetrical arrangement around a central axis of the substrate perpendicular to its major surface, e.g. disposed at the vertices of an equilateral triangle centered on that axis, or more generally of a polygon similarly centered. The required asymmetry may be introduced by, inter alia, two means:

Firstly, a pin may be provided which is offset toward the edge of the substrate and is operated so that it is driven upwards to engage the substrate before the symmetrical pins so as to impart a very slight tilt to the substrate to break the sticking between the substrate and substrate table. Thereafter, the symmetrical pins (and, optionally, the offset pin) are moved upwards in unison, lifting the substrate clear of the substrate table.

Secondly, a symmetrical set of pins may be provided, but with one pin having its upper extremity very slightly higher than the others, so that it contacts the substrate ahead of the other pins and very slightly tilts the substrate.

Thus, according to an embodiment of the present invention, there is provided a lithographic projection apparatus, comprising:

an illumination system arranged to condition a radiation beam;

a support structure configured to hold a patterning device, the patterning device being capable of imparting the radiation beam with a pattern;

a substrate table configured to hold a substrate;

a projection system arranged to project the patterned radiation beam onto a target portion of the substrate;

a liquid supply system configured to at least partly fill a space, between the projection system and the substrate table, with a liquid; and a substrate positioner configured to move the substrate out of contact with a substrate table surface, the substrate positioner being adapted to initially exert a force on the substrate that is offset from the center of the substrate so as to overcome a tendency of liquid, from the liquid supply system, between the substrate and substrate table surface to cause the substrate to stick to the substrate table surface.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to any device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which:

FIG. 7 is a view corresponding to FIG. 5, of a first embodiment of the invention;

FIG. 8 is a view corresponding to FIG. 5, of a second embodiment of the invention;

DETAILED DESCRIPTION

Figure 1:
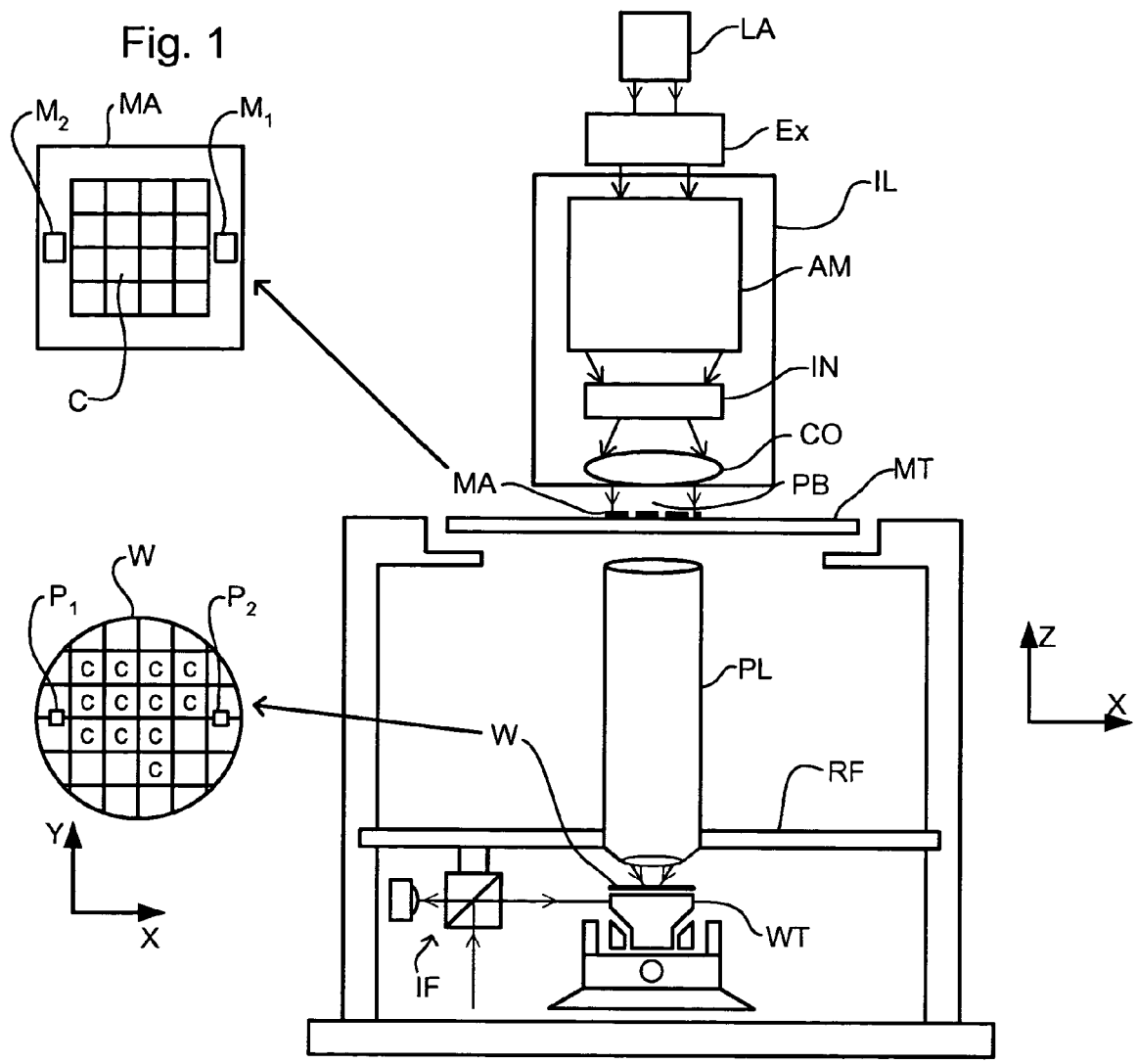
FIG. 1 depicts a lithographic projection apparatus according to an embodiment of the invention.
Figure 2:
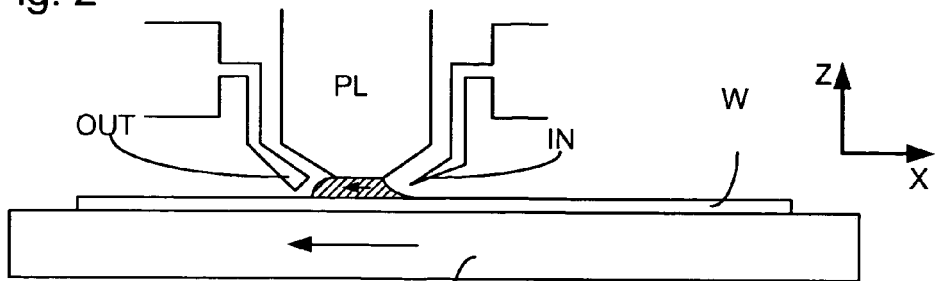
FIG. 2 is a side view of a liquid supply system.
Figure 3:
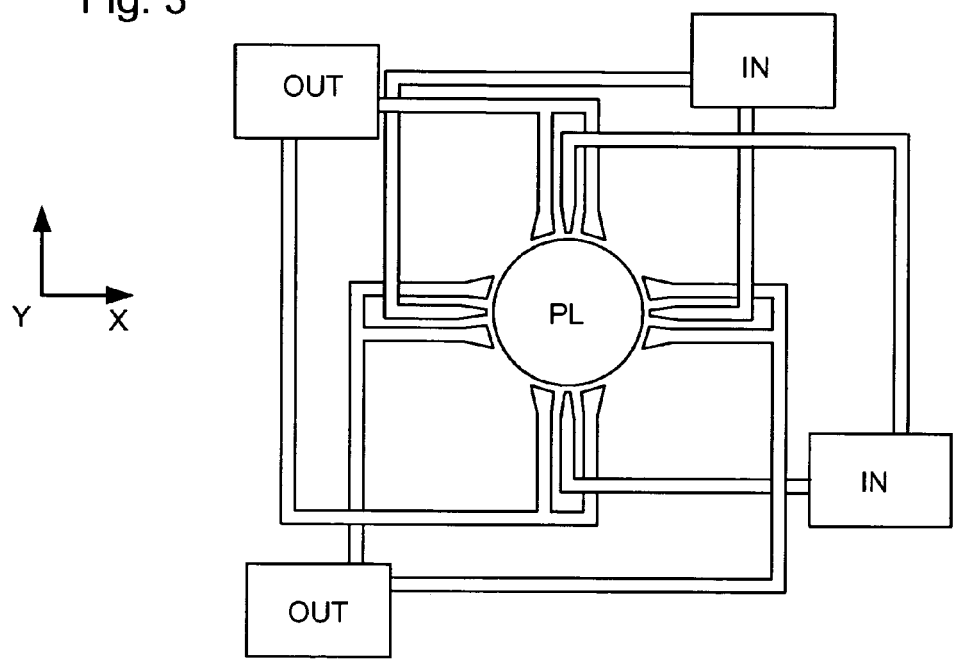
FIG. 3 is a plan view of the liquid supply system of FIG. 2.

FIG. 1 schematically depicts a lithographic apparatus according to a particular embodiment of the invention. The apparatus comprises:

an illumination system (illuminator) IL for providing a projection beam PB of radiation (e.g. UV radiation).

a first support structure (e.g. a mask table) MT for supporting patterning device (e.g. a mask) MA and connected to first positioner PM for accurately positioning the patterning device with respect to item PL;

a substrate table (e.g. a wafer table) WT for holding a substrate (e.g. a resist-coated wafer) W and connected to second positioner PW for accurately positioning the substrate with respect to item PL; and a projection system (e.g. a refractive projection lens) PL for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioner PW and position sensor IF (e.g. an interferometric device), the substrate table WT can be moved accurately, e.g. so as to position different target portions C in the path of the beam PB. Similarly, the first positioner PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioners PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 5:
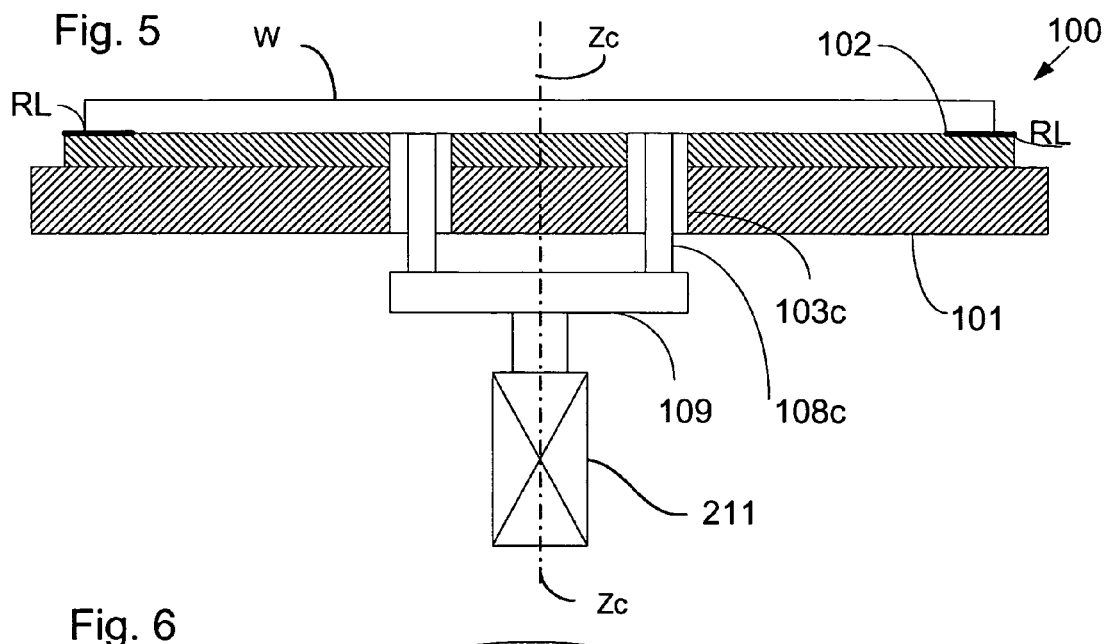
FIG. 5 illustrates in schematic cross section a substrate table and a substrate release mechanism.
Figure 6:
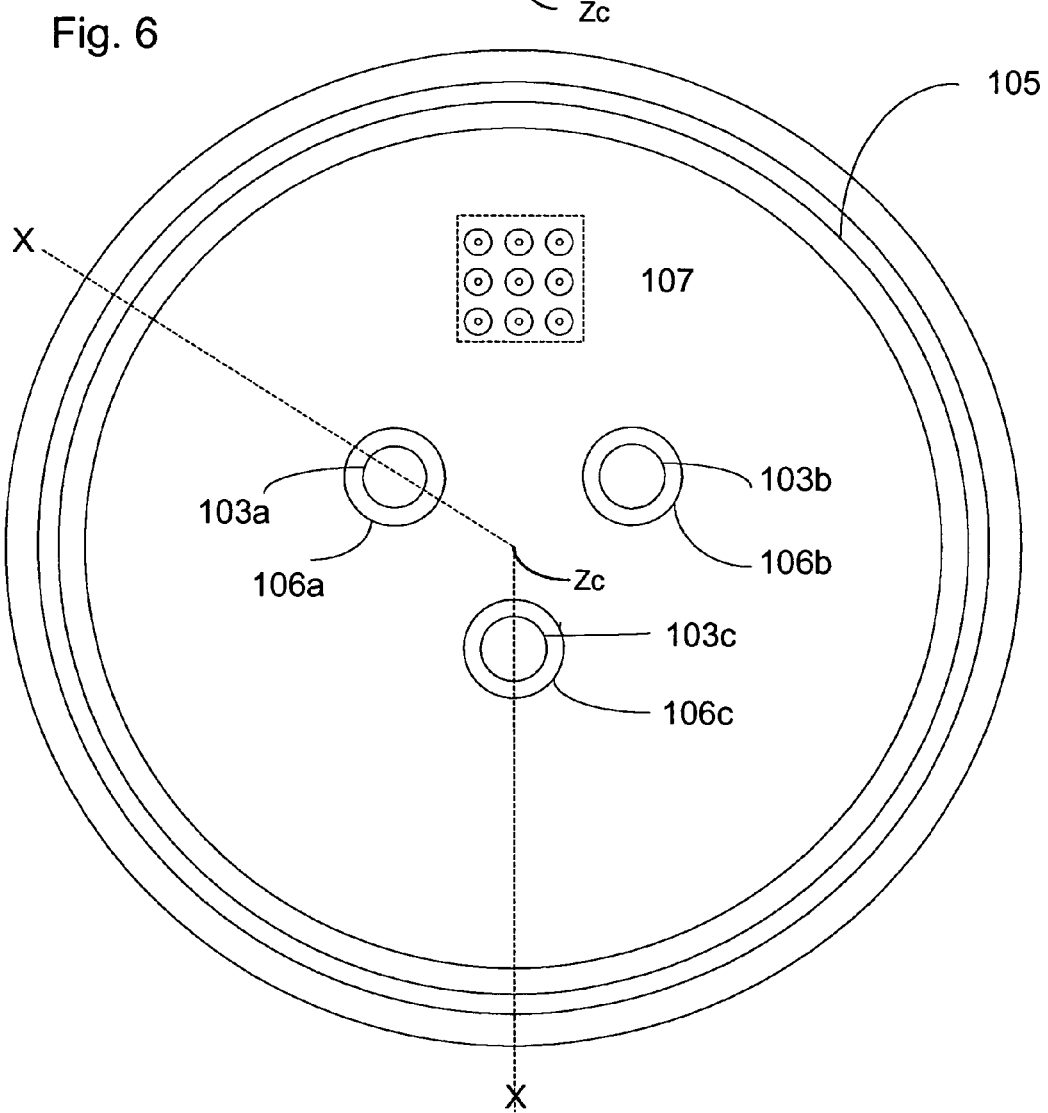
FIG. 6 is a plan view of the "pimple plate" of the substrate table of FIG. 5.

FIGS. 5 and 6 illustrate a typical substrate release mechanism of a substrate table. In FIG. 5, the substrate table 100 comprises a substrate table part 101 made of a material having substantially zero thermal coefficient of expansion such as Zerodur, atop of which is a so-called pimple- or burl-plate 102. The cross-section of FIG. 5 is taken along the line X—X in FIG. 6.

Defined vertically through the table part 101 and plate 102 are three through-holes 103a–c which allow pins, described below and that are part of the substrate release mechanism, to come into engagement with the lower surface of the substrate during, for example, a releasing operation.

The upper major surface of the plate 102 has a recessed surface which defines, together with the lower major face of the substrate, a laminar underpressure chamber which, because of its small height, is not convenient to show in FIGS. 5 and 6. When the substrate W is to be held against the plate 102, this chamber is evacuated by means of a pump (not shown) and passageways (also not shown) through the table part 101 and plate 102.

FIG. 6 is a top view of the plate 102 showing the upper major surface thereof. It has a continuous outer rim 105, which seals the underpressure chamber from the exterior, three collars 106a–c, which surround the through-holes 103a–c for the pins and prevent gaseous leakage into the chamber through them, a multiplicity of small protrusions 107, which are also known as "pimples", extending from the upper major surface of the plate 102 and arrayed uniformly across the recessed part of the plate to provide support for the substrate (against the action of the vertical differential pressure), and downwardly-directed through-holes (not shown) defined through the body of the plate to connect the chamber to a vacuum pump. The plate 102 is manufactured such that the upper surfaces of the rim 105, pimples 107 and collars 106a–c are substantially co-planar so as to define essentially a single, horizontal plane of support for the substrate W.

The through-holes 103 are arranged symmetrically, at the vertices of an equilateral triangle centered on the central vertical axis Zc of the substrate table 100 and of the substrate W. The axis Zc substantially coincides with the center of gravity of the substrate W. Coaxially within these through-holes 103, and consequently similarly symmetrically arranged, are three pins 108a–c which are of equal length and held by a rigid carrier plate 109 below and substantially parallel to the plate 102 and table part 101. The upper extremities of the pins, which in this case are circular surfaces, coincide in a horizontal plane, which is substantially parallel to the lower face of the substrate. As used herein, the terms pin or pins include any type of projection (of any length) or discrete support surface.

Once the pressure in the underpressure chamber has been increased, the pins may be driven upwardly, e.g. by moving the carrier plate 109 upwardly from the position shown in FIG. 5, to lift the substrate from the plate 102.

As described above, residual liquid RL remaining from immersion of the substrate may extend around all or part of the periphery of the lower face of the substrate and cause a tendency for the substrate W to stick to the plate 102.

FIGS. 7 and 8 show substrate release mechanisms according to embodiments of the invention. The structure and operation of these embodiments are the same as for the mechanism of FIGS. 5 and 6, except as specifically noted hereafter.

In the embodiment of FIG. 7, in addition to the group of three pins 108a–c already described, there is an additional, independently actuable pin 208 and associated through-hole 203 defined through table part 101 and plate 102. The linear motor actuator 210 associated with the additional pin 208 is operated in timed relationship to the linear motor actuator 211 associated with the group of three pins 108a–c such that the additional pin 208 comes into contact with, and starts pushing against, the lower face of the substrate W before any of the other pins 108a–c do. The substrate thus initially experiences an upward force which is offset along a radius from the central vertical axis Zc. This has the effect of slightly tilting the substrate so that the residual liquid film around the substrate edge portion adjacent the additional pin tends to separate, while the diametrical opposite edge portion of the substrate reduces the thickness of the film in that region. This can overcome the sticking action of the substrate W against the plate 102. Thereafter, the linear actuator 211 of the pins 108a–c is activated, causing these to project through their respective through holes and push against the underside of the substrate, lifting the substrate clear of the plate.

Figure 9:
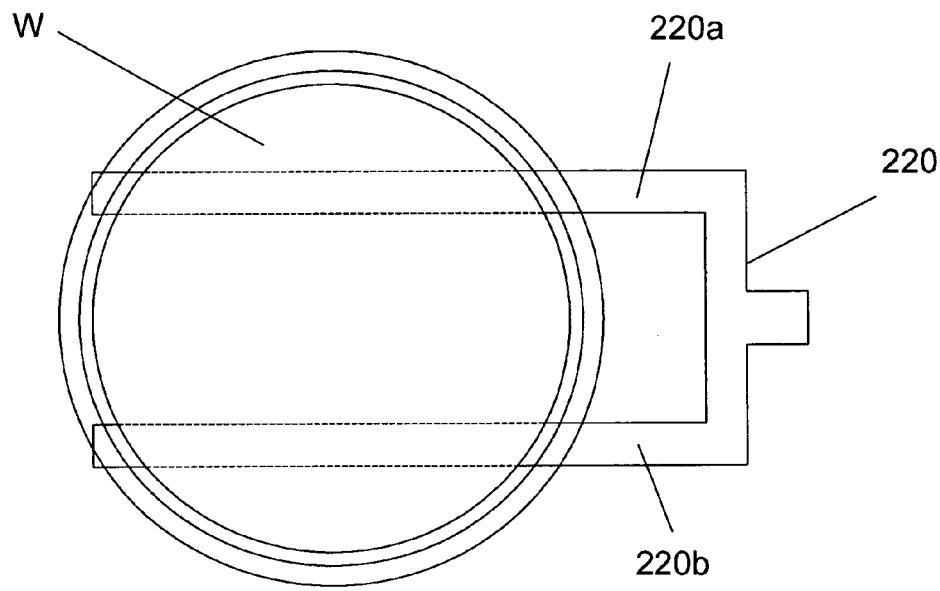
FIG. 9 shows an example substrate removal device for use with the lithographic apparatus.

As shown in FIG. 9, the tines 220a, 220b of a motor-driven carrier fork 220 can then be inserted under the substrate W and the actuators 210, 211 can be operated to retract the pins so that the substrate W settles onto the fork 220 and can be carried away for further processing.

Figure 10:
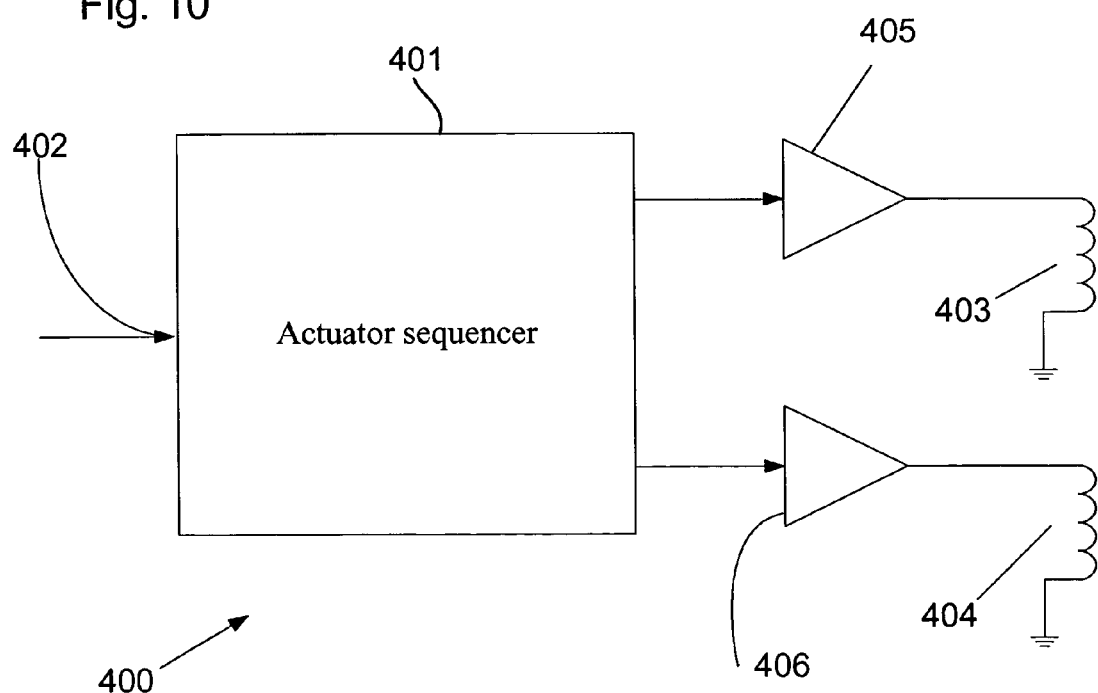
FIG. 10 is a block circuit diagram illustrating a control circuit for use with the embodiment of FIG. 7.

The actuators 210, 211 of the pins may be linear electric motors e.g. of the well-known voice-coil type. FIG. 10 shows schematically circuitry 400 which may be associated with such motors to coordinate their operation. An actuator sequencer 401, which may be implemented by analog or digital circuitry or by operation of software responds to a signal which is applied to an input 402 when a substrate release operation is to begin. The sequencer 401 controls and coordinates the energizing of the armature coils 403, 404 of motors 210, 211 via power amplifier stages 405, 406 such that, in response to that signal, the motor 210 associated with the additional pin 208 activates first so as to push the pin 208 against the substrate W, as described above, to overcome the sticking effect. Then, after a suitable time interval to allow that to occur, the motor 211 of the pins 108a–c is activated to lift the substrate W clear of the plate 102; the pin 208 can be withdrawn once the substrate is resting on the pins 108a–c.

FIG. 8 shows a further embodiment of the invention in which, as in FIG. 5, there is no additional pin 208, just the group of pins 108a–c. Instead, in order to facilitate the release of the substrate W, one, 108a, of the pins is made very slightly longer than the others, 108b,c (this difference in length is exaggerated in FIG. 8 for ease of illustration and in practice may be of the order of 10 µm, preferably not more than 5 mm). The top face of that pin 108a consequently stands higher than those of the other pins and so comes into contact with the underside of the substrate before the others do. This effects the tilting movement as described with reference to FIG. 7 and overcomes the sticking of the substrate to the plate. Further upward movement of the group of pins 108a–c brings the other pins 108b,c into contact with the underside of the substrate lifting it clear of the plate 102 and allowing the insertion of the carrier fork 220 as in FIG. 7.

In both embodiments, e.g., as depicted in FIGS. 7 and 8, the substrate is initially acted upon by a pin force which is offset from the axis Zc and overcomes the sticking effect caused by any residual liquid around the periphery of the substrate.

Numerous variants of the above which are within the scope of the appended claims will be apparent to those skilled in the art. For example, although in the embodiments above, the pins are passive, fixed length, elements whose movement is effected by a linear actuator acting upon and moving their carrier(s), other methods of driving the pins are possible. In one implementation, the pin carrier(s) remain stationary and instead each pin is mounted to its carrier via an individual linear motor; the operation of these motors is then coordinated to give the pin movements described with reference to FIGS. 7 and 8.

An alternative way of creating an asymmetric force on the substrate W would be to have an asymmetric arrangement of pins. Three pins could be arranged, for example, in an isosceles triangle with one pin significantly closer to the circumference of the substrate W.

Also, there is no limitation as to the number of pins. Although three pins are required to define a support plane for the substrate, there need not be three pins in a central group: for example, an additional, offset pin such as 208, could act as the third pin for the purpose of stabilizing and lifting the substrate. Alternatively or additionally, there could be more than three pins in a central, symmetrical, group around the axis Zc. Likewise, there need not be only one pin used to cause the initial, asymmetrical tilting force on the substrate.

To reduce the force required to release the substrate W, the materials used for plate 102 can be chosen to minimize the capillary action and surface tension adhering the substrate W to the plate 102. For example, a hydrophobic material could be used to coat the plate 102.

As used herein, a substrate positioner includes any device to move the substrate into contact (whether in whole or in part) with a surface of the substrate table and/or out of contact (whether in whole or in part) with a surface of the substrate table. Such a device may use mechanical, electrical, magnetic, vacuum, etc. force to displace the substrate and may include, without limitation, any actuator, motor, magnetic arrangement, pump, etc. to provide the force. In the case of mechanical force, such force may be applied to the substrate using any type of component including pins, plates, shafts, etc. The substrate positioner includes without limitation any of the embodiments disclosed herein such as a substrate release mechanism described above comprising an actuator(s) and pins.

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application Ser. No. 10/705,783, hereby incorporated in its entirety by reference.

Figure 4:
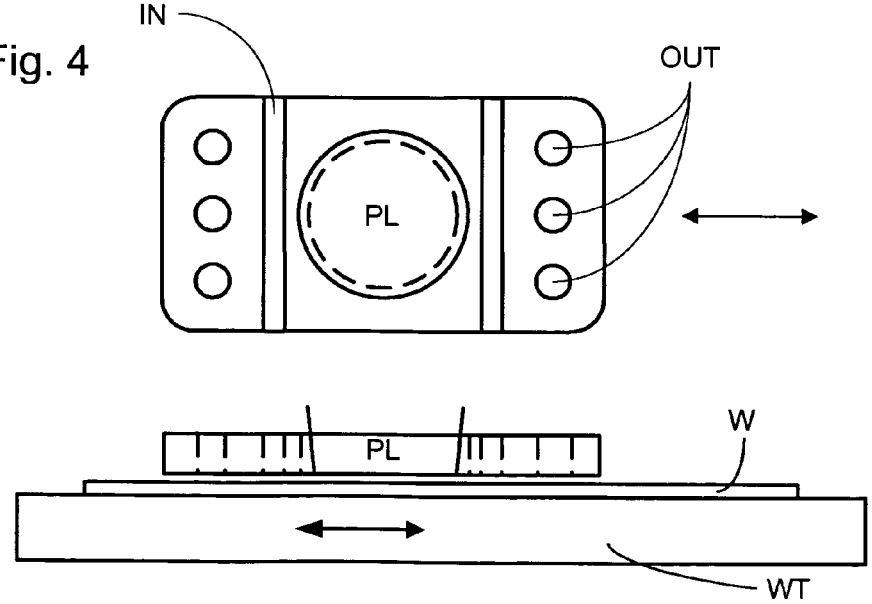
FIG. 4 depicts another liquid supply system.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

While specific embodiments of the invention have been described above, it will be appreciated that the invention may be practiced otherwise than as described. The description is not intended to limit the invention.

The invention claimed is:

1. A lithographic projection apparatus, comprising:
an illumination system arranged to condition a radiation beam;
a support structure configured to hold a patterning device, the patterning device being capable of imparting the radiation beam with a pattern;
a substrate table configured to hold a substrate;
a projection system arranged to project the patterned radiation beam onto a target portion of the substrate;
a liquid supply system configured to at least partly fill a space, between the projection system and the substrate table, with a liquid; and
a substrate positioner configured to move the substrate out of contact with a substrate table surface, the substrate positioner being adapted to initially exert a resultant force on the substrate that is offset from the center of the substrate so as to overcome a tendency of liquid, from the liquid supply system, between the substrate and substrate table surface to cause the substrate to stick to the substrate table surface.

2. The apparatus of claim 1, wherein the substrate positioner comprises a plurality of pins, disposed on the substrate table, to move the substrate out of contact with the substrate table surface.

3. The apparatus of claim 2, wherein the substrate table comprises a plurality of through-holes defined through the substrate table surface and the respective pins are movable through the through-holes.

4. The apparatus of claim 1, wherein the positioner comprises three pins, one pin of which is disposed and arranged to come into contact with and push the substrate before any other pins do.

5. The apparatus of claim 4, comprising an independently operable actuator configured to drive the one pin and one or more independently operable actuators to drive the other pins, whether individually or together.

6. The apparatus of claim 5, wherein three pins are arranged in a symmetrical fashion around a center on the substrate table surface.

7. The apparatus of claim 4, comprising independently movable carriers on which the one pin and the other pins are respectively mounted.

8. The apparatus of claim 7, comprising independently operable linear actuators configured to drive the respective movable carriers.

9. The apparatus of claim 4, wherein the pins are in a fixed positional relationship with one another and the one pin has its end, which is configured to contact the substrate, positioned such that it will come into contact with and push the substrate before any of the other pins do.

10. The apparatus of claim 9, comprising a carrier on which the pins are mounted in common and a linear actuator configured to drive the carrier.

11. The apparatus of claim 9, wherein the pins are arranged in a symmetrical fashion around a center on the substrate table surface.

12. A device manufacturing method comprising:
projecting a patterned beam of radiation through a liquid onto a target portion of a substrate positioned on a surface of a substrate table; and
in moving the substrate out of contact with the substrate table surface, initially exerting a resultant force on the substrate that is offset from the center of the substrate so as to overcome a tendency of liquid between the substrate and substrate table surface to cause the substrate to stick to the substrate table surface.

13. The method of claim 12, wherein moving the substrate out of contact with the substrate table surface comprises moving the substrate using a plurality of pins disposed on the substrate table.

14. The method of claim 12, wherein moving the substrate out of contact with the substrate table surface comprises moving the substrate using three pins and wherein initially exerting a force on the substrate that is offset from the center of the substrate comprises moving the substrate using one of the pins to contact and push the substrate before any of the other pins do.

15. The method of claim 14, comprising independently actuating the one pin to move and independently actuating the other pins to move, whether individually or together.

16. The method of claim 15, wherein three pins are arranged in a symmetrical fashion around a center on the substrate table surface.

17. The method of claim 14, wherein the pins are in a fixed positional relationship with one another and the end of the one pin comes into contact with and pushes the substrate before any of the other pins do.

18. The method of claim 17, wherein the pins are mounted on a common carrier and comprising linearly actuating the carrier to move.

19. The method of claim 17, wherein the pins are arranged in a symmetrical fashion around a center on the substrate table surface.

* * * * *